United States Patent
Kuramasu et al.

(10) Patent No.: US 6,534,353 B1
(45) Date of Patent: Mar. 18, 2003

(54) METHOD OF FABRICATING A THIN-FILM TRANSISTOR

(75) Inventors: Keizaburo Kuramasu, Kyotanabe (JP); Atsushi Sasaki, Toyonaka (JP); Tetsuo Kawakita, Kyotanabe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/971,661

(22) Filed: Oct. 9, 2001

Related U.S. Application Data

(62) Division of application No. 09/720,679, filed on Dec. 29, 2000.

(51) Int. Cl.⁷ .............................................. H01L 21/336
(52) U.S. Cl. ..................... 438/197; 438/162; 257/59; 257/67
(58) Field of Search ................. 438/482, 486, 438/471–476, 487, 166, 162, 197; 257/59, 67

(56) References Cited

FOREIGN PATENT DOCUMENTS

| JP | 58-56457 | 4/1983 |
|---|---|---|
| JP | 58-86717 | 5/1983 |
| JP | 58-185500 | 10/1983 |
| JP | 62-262431 | 11/1987 |
| JP | 64-46968 | 2/1989 |
| JP | 02-130914 | 5/1990 |
| JP | 03-292723 | 12/1991 |
| JP | 4-101413 | 4/1992 |
| JP | 05-206468 | 8/1993 |
| JP | 06-124962 | 5/1994 |
| JP | 08-181302 | 7/1996 |
| JP | 9-213630 | 8/1997 |
| JP | 10-144923 | 5/1998 |

OTHER PUBLICATIONS

Patent Abstracts of Japan, 10–261799, Sep. 29, 1998.
Patent Abstracts of Japan, 08–078330, Mar. 22, 1996.
Patent Abstracts of Japan, 04–286366, Oct. 12, 1992.
Patent Abstracts of Japan, 02–014533, Jan. 18, 1990.
Patent Abstracts of Japan, 64–076715, Mar. 22, 1989.

*Primary Examiner*—David Nelms
*Assistant Examiner*—Dung A Le
(74) *Attorney, Agent, or Firm*—Parkhurst & Wendel, L.L.P.

(57) ABSTRACT

A method of fabricating a thin-film transistor including forming a polycrystalline semiconductor thin film on a substrate by irradiating with a laser beam an amorphous semiconductor thin film formed on the substrate. Heat treating the polycrystalline semiconductor thin film while the substrate is held by a substrate holder provided in a container containing hydrogen, and processing, prior to or after the heat treating, the polycrystalline semiconductor thin film into a specified configuration.

6 Claims, 13 Drawing Sheets

METHOD OF FABRICATING A THIN-FILM TRANSISTOR

This is a Division of application Ser. No. 09/720,679 filed Dec. 29, 2000, now pending.

TECHNICAL FIELD

The present invention relates to a thin-film transistor and, more particularly, to a thin-film transistor (element) for use in a driving circuit for a liquid-crystal display device and to a method of fabricating the same.

BACKGROUND ART

At present, liquid-crystal display devices driven by thin-film transistors (TFTs) as thin-film semiconductor elements are used widely in a notebook personal computer, a vehicle navigator, and the like and requested to be further reduced in size, weight, and cost in the future. To respond to the request, there has been developed a polycrystalline silicon thin-film transistor which allows integral formation of even driving circuits for a pixel portion with a substrate having a display portion and the pixel portion for the display portion formed therein and higher performance thereof has been pursued. Referring to the drawings, a method of fabricating a conventional polycrystalline silicon thin-film transistor will be described.

FIG. 1 is a structural cross section of a thin-film transistor of the type termed "top-gate" produced in accordance with a conventional method. In the drawing, 1 denotes a transparent insulating substrate made of quartz, glass, or the like, in which glass is used normally in terms of cost; 2 denotes a polycrystalline silicon thin film; 3 denotes a gate insulating film; 4 denotes a gate electrode; 5 denotes an interlayer insulating film; 6 denotes a source electrode film; 7 denotes a drain electrode film; and 13 denotes an underlying layer (so-called undercoat), which is formed with the view to preventing some components of a substrate materiel from being diffused in the polycrystalline silicon thin film but may not be formed in some cases depending on the substrate material or a method of processing the substrate.

In practice, such thin-film transistors used as switches for the pixel portion and in driving circuits therefor are arranged in rows and columns in vertical and lateral directions and at locations determined by the display surface of a liquid-crystal display device as a product and by the driving circuits formed in the peripheral portion thereof. However, since the foregoing is so-called well-known technology and is not relevant directly to the present invention, intentional depiction thereof is omitted.

A method of fabricating the thin-film transistors, which is relevant directly to the present invention, will be described briefly herein below, though it is so-called well-known technology.

First, a silicon dioxide thin film 13 is formed as the underlying layer on the transparent insulating substrate 1 made of glass or the like by plasma chemical vapor deposition (PCVD), sputtering, or the like.

Then, an amorphous silicon thin film is formed entirely over the substrate or at a specified location thereon by PCVD, chemical vapor deposition (CVD), or sputtering.

Next, an excimer laser is applied to an amorphous silicon thin film thus formed to temporarily melt the amorphous silicon thin film (so-called laser annealing), thereby forming the polycrystalline silicon thin film 2 composed of grains (particles) each having a relatively large diameter by utilizing the crystallization of silicon during the solidification thereof.

Next, the polycrystalline silicon thin film is processed into a specified configuration determined by the arrangement of transistors (elements) on the substrate. In short, so-called patterning is performed.

Next, the gate insulating film 3 is formed on the patterned polycrystalline silicon thin film by normal pressure CVD, PCVD, sputtering, or like method and the gate electrode 4 is formed at a specified location on the gate insulating film 3.

Next, the interlayer insulating film 5 is formed and contact holes are formed by etching in the portions of the interlayer insulating film in which the source and drain electrodes of each of the transistors are to be formed.

Next, the source and drain electrodes 6 and 7 of each of the transistors are formed by using the contact holes, whereby the polycrystalline silicon thin-film transistor is produced.

It will be appreciated that, if necessary, the cleaning of the substrate, the implantation of impurity ions required by the element to perform its intrinsic function, i.e., phosphorus (P) or boron (B) ions into the source and drain regions, a heat treatment subsequently performed to join a dangling bond or expel excess hydrogen, wiring required by the element to perform its intrinsic function, and the like are performed in addition to the foregoing process steps. Since these process steps are also well-known technology and not relevant directly to the present invention, the description thereof is omitted here.

A description will be given next to irradiation conditions for laser annealing.

To improve the characteristics of the thin-film semiconductor element, the film should have a large and uniform crystal grain diameter. If the crystal grain diameter is to be increased by laser annealing, it is effective to perform irradiation with high energy or irradiate the same portion several times. As a result of such irradiation, however, the grain diameter loses uniformity, the characteristics of the thin-film semiconductor element vary greatly, or heat is transmitted to the glass substrate to cause the deformation of glass or the diffusion of a glass component into the thin-film semiconductor, so that the performance of the semiconductor element degrades against expectations. It is to be noted that the heat resistance temperature of the glass substrate used in the liquid crystal display device is 600° C.

Under the present circumstances, therefore, polycrystallization is performed by applying a laser under conditions which are a trade-off between the size and uniformity of the crystal grain diameter and the adverse effects of heat on the glass substrate.

In addition to the foregoing, there has been adopted the approach of optimizing the energy density of a laser beam in consideration of the thickness of a silicon film or the like, though the description thereof is omitted here since it is not relevant directly to the present invention.

However, the method encounters the following problems during melting recrystallization.

(1) FIG. 2 is a cross-sectional view of a polycrystalline silicon thin film formed by melting recrystallization involving excimer laser annealing. As shown in the drawing, numerous projections 11 are formed at a surface of the polycrystalline silicon thin film 2, particularly at the grain boundaries. Moreover, tramp materials ("impurities" in another technical field) 12, which are unnecessary by nature for the transistor element to perform its intrinsic function, e.g., oxygen in an atmosphere, hydrogen from moisture, boron (B) from glass pieces jumped from a HEPA filter, and the like are taken in by the surface portion.

In this case, these tramp materials are not only located in large quantities in the surface which is chemically and physically unstable during the polycrystallization of the amorphous silicon during which the amorphous silicon is temporarily melted at a high temperature achieved by laser irradiation and then solidified but also segregated at the upper surface of silicon from the lower portion thereof with solidification (aggregate in a large quantity from inside silicon). In particular, the tramp materials are assumed to be segregated in large quantities in the projections, which are chemically unstable because of the segregated tramp materials. If oxygen is a tramp material, it is bonded to silicon as a semiconductor in an extremely complicated and unstable state instead of reacting therewith to form a silicon dioxide. It is to be noted that oxygen forms compounds with silicon, carbon, or the like belonging to Group IV at a ratio of either 1:1 (e.g., a carbon monoxide or silicon monoxide) or 2:1 (e.g., carbon dioxide gas or a silicon dioxide) and therefore does not achieve a constant composition. Under special conditions such as in the surface of the amorphous silicon which is solidified immediately after melted, an extremely complicated compound is formed accordingly.

The use of a material obtained by mixing at most 30% germanium or at most 5% carbon in silicon is also examined at present and the development of the material, which is not pure silicon, is pursued since it has various characteristics of easy crystallization because of its lower melting point and the capability of providing a high mobility. However, since the materials used in these cases are inherently mixtures, the surfaces thereof in particular suffer non-uniformity resulting from projections and depressions and increasing segregation of not only the tramp material but also the intrinsic semiconductor material.

In the top-gate-type transistor, the surface portion is a portion in contact with the gate insulating film. Therefore, the surface projections adversely affect the insulation resistance of the overlying gate insulating film. On the other hand, the segregation of the tramp materials destabilizes the interfacial portion with the gate insulating film for the reason stated above. Both of the surface projections and the segregated tramp materials adversely affect the performance and reliability of the thin-film transistor as an element and may cause variations in the performance or the like of the semiconductor element.

Although ion doping is performed subsequently with respect to the source and channel regions by using $PH_3$ and $B_2H_6$ to form a C-MOS structure and a heat treatment is performed for the activation thereof, the presence of the projections impairs the uniformity of the impurity ions implanted. This qualitatively causes variations in the characteristics of the TFT.

(2) Although the trade off irradiation conditions described above ensure the uniformity of the characteristics of the polycrystalline silicon as the active region of the thin-film semiconductor element, the electric characteristics thereof including field-effect mobility are reduced compared with those of a monocrystalline silicon semiconductor element. Accordingly, it is difficult to constantly provide circuit functions sufficient for a future liquid crystal display device.

As a result, it has been demanded to develop a polycrystalline silicon film having no projection at the surface thereof, particularly at the interface with the gate electrode portion, and no segregation of tramp materials after laser annealing or having a surface in a stable state and develop a thin-film semiconductor element with excellent performance.

It has also been demanded to develop thin-film transistors each having excellent electric characteristics including field-effect mobility, while ensuring the uniformity of numerous thin-film semiconductor elements formed on a substrate.

DISCLOSURE OF THE INVENTION

To attain the foregoing objects, during the fabrication of a top-gate-type thin-film transistor (element) in accordance with the first group of the invention, a polycrystalline semiconductor thin film is formed by irradiating an amorphous semiconductor thin film formed on a substrate, particularly a thin film made of silicon or containing silicon as a main component, with a laser beam and thereby polycrystallizing the thin film. The polycrystalline semiconductor thin film is then exposed to an active, reactive gas such that a surface layer thereof is etched away, whereby a surface of the polycrystalline semiconductor thin film is planarized and surface portions in which tramp materials are segregated are removed. Moreover, the type of the reactive gas is determined carefully and the etching process using the reactive gas is performed inventively such that a thin-film semiconductor element with high mobility and high reliability is provided.

During the formation of a top-gate-type transistor on a substrate in accordance with the second group of the invention, an amorphous semiconductor thin film, particularly a thin film made of silicon or containing silicon as a main component, is formed and polycrystallized by laser annealing, similarly to the first group of the invention. However, the second group of the invention is characterized in that means of mechanical polishing or not only mechanical but also chemical polishing is adopted to planarize a surface of the polycrystalline semiconductor thin film and remove surface portions in which tramp material have been segregated.

Moreover, a ceramic-based thin film with a high hardness is formed on the substrate such that the substrate is planarized by mechanical and chemical polishing and the tramp materials are removed. The thin film is also used for proper formation of the semiconductor thin film and for the retention of the strength of the substrate.

For this purpose, the material and thickness of the ceramic-based thin film and the engineering and mechanical properties thereof are determined carefully such that a thin-film semiconductor element with high mobility and high reliability is provided.

The third group of the invention is similar to the foregoing two groups of the invention in that an amorphous semiconductor thin film, particularly a thin film made of silicon or a material containing silicon as a main component, is formed on a substrate and polycrystallized by laser annealing. However, the second group of the invention is characterized in that a heat treatment is performed at a high temperature of 550° C. or more and the atmospheric gas during the heat treatment is determined carefully for the planarization of the surface, for the growth of the polycrystalline semiconductor into a larger crystal, and for the removal of the tramp materials segregated in the surface.

The third group of the invention also planarizes the surface portion of the polycrystalline silicon thin film and removes the projections in which the tramp materials have been segregated in the top-gate-type transistor, provides an excellent interface with the gate insulating film, and provides a thin-film semiconductor element with high mobility and high reliability, similarly to the foregoing two groups of the invention. However, the third group of the invention is slightly different therefrom in that it is also applicable to a bottom-gate-type transistor in terms of promoting the growth of a crystal.

EXPLANATIONS OF LETTERS OR NUMERALS

1 Transparent Insulating Substrate
2 Polycrystalline Silicon Thin Film
3 Gate Insulating Film
4 Gate Electrode Film
5 Interlayer Insulating Film
6 Source Electrode (Film)
61 Titanium in Lower Portion of Source Electrode
7 Drain Electrode (Film)
71 Titanium in Lower Portion of Drain Electrode
8 Thin Film with High Hardness
10 Region Formed with Transistor
11 Projection of Polycrystalline Silicon Thin Film
110 Swell of Grain Boundary of Polycrystalline Silicon Thin Film
12 (Segregated) Impurity in Surface Portion
13 Underlying Layer
14 Planarizing Film
15 Amorphous Silicon Thin Film
16 Grain Boundary of Polycrystalline Silicon
20 Bell-Jar
21 RF Excitation Power Source
22 RF Electrode Plate
23 RF Electrode Plate
24 Heater
25 Substrate Holder
26 Mesh Electrode

BEST MODE FOR CARRYING OUT THE INVENTION

The present invention will be described herein below based on the embodiments thereof.

Embodiment 1

The present embodiment pertains to the first group of the invention and relates to the planarization of a surface of a polycrystalline silicon thin film by using a reactive gas and to the removal of portions thereof in which tramp materials are segregated.

Figure 3:
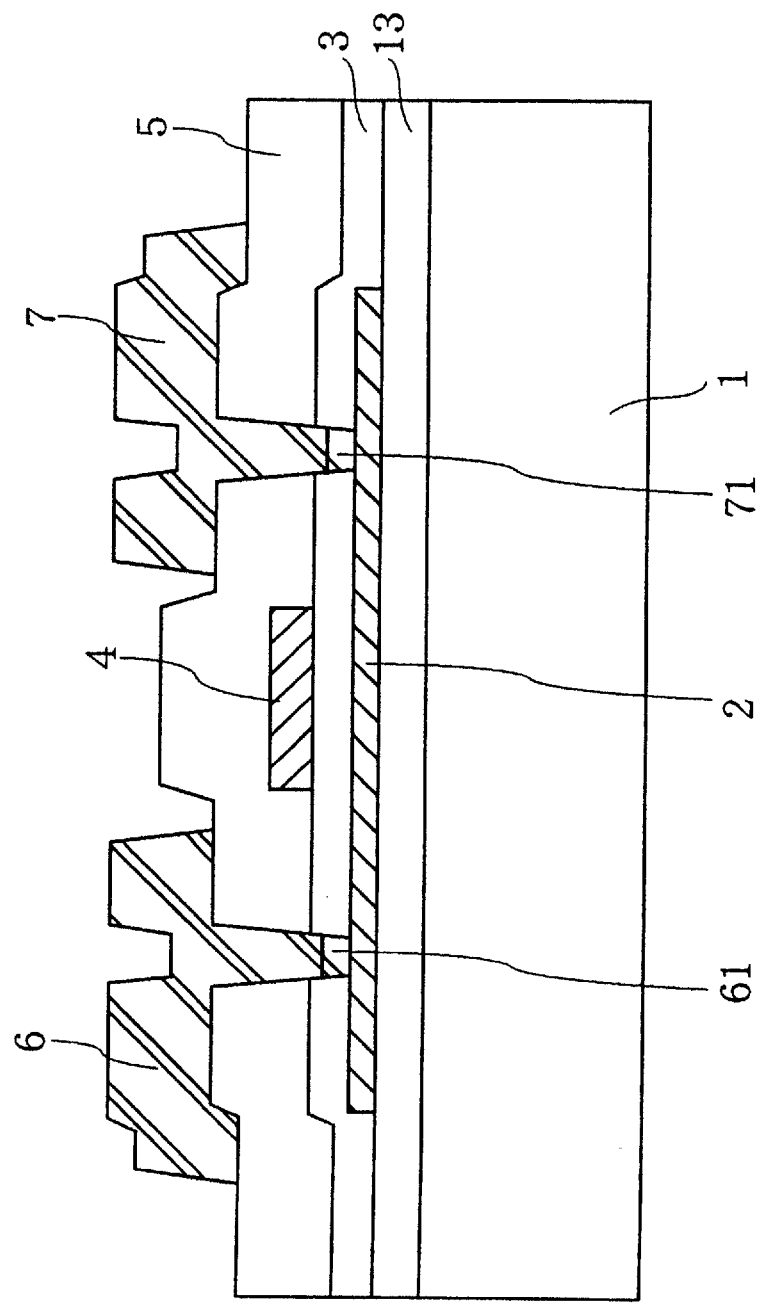
FIG. 3 is a cross-sectional view of a polycrystalline silicon thin-film transistor fabricated in accordance with a fabrication method of a first embodiment of the present invention.
Figure 4:
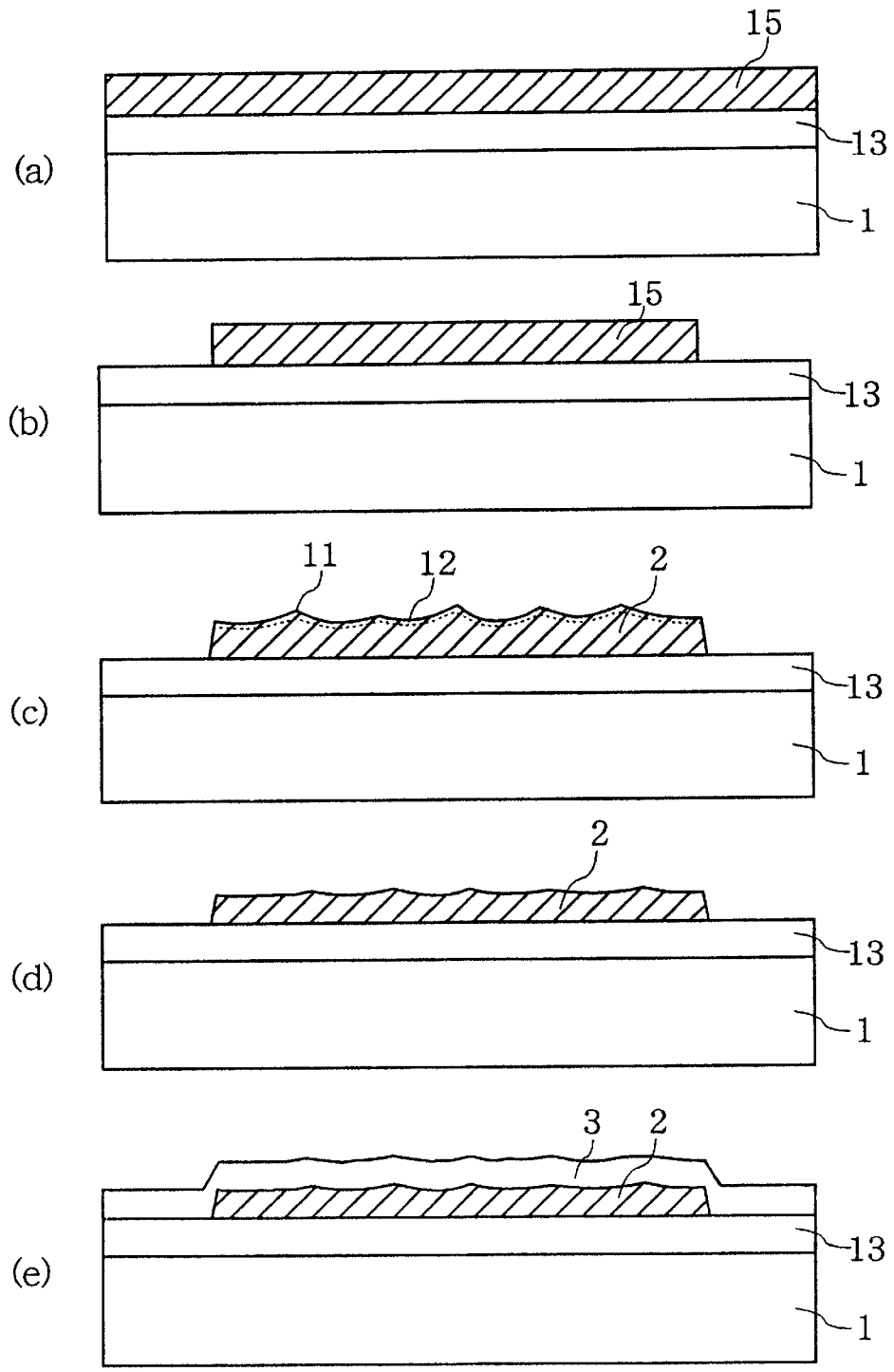
FIG. 4 are views showing the cross-sectional structure of the polycrystalline silicon thin-film transistor in the foregoing embodiment, which changes as the fabrication thereof proceeds.

FIG. 3 is a cross-sectional view of a thin-film transistor produced in accordance with a method of fabricating a thin-film transistor as the first embodiment of the present invention. FIGS. 4 are cross-sections thereof in the individual states of the principal fabrication process steps therefor.

Figure 1:
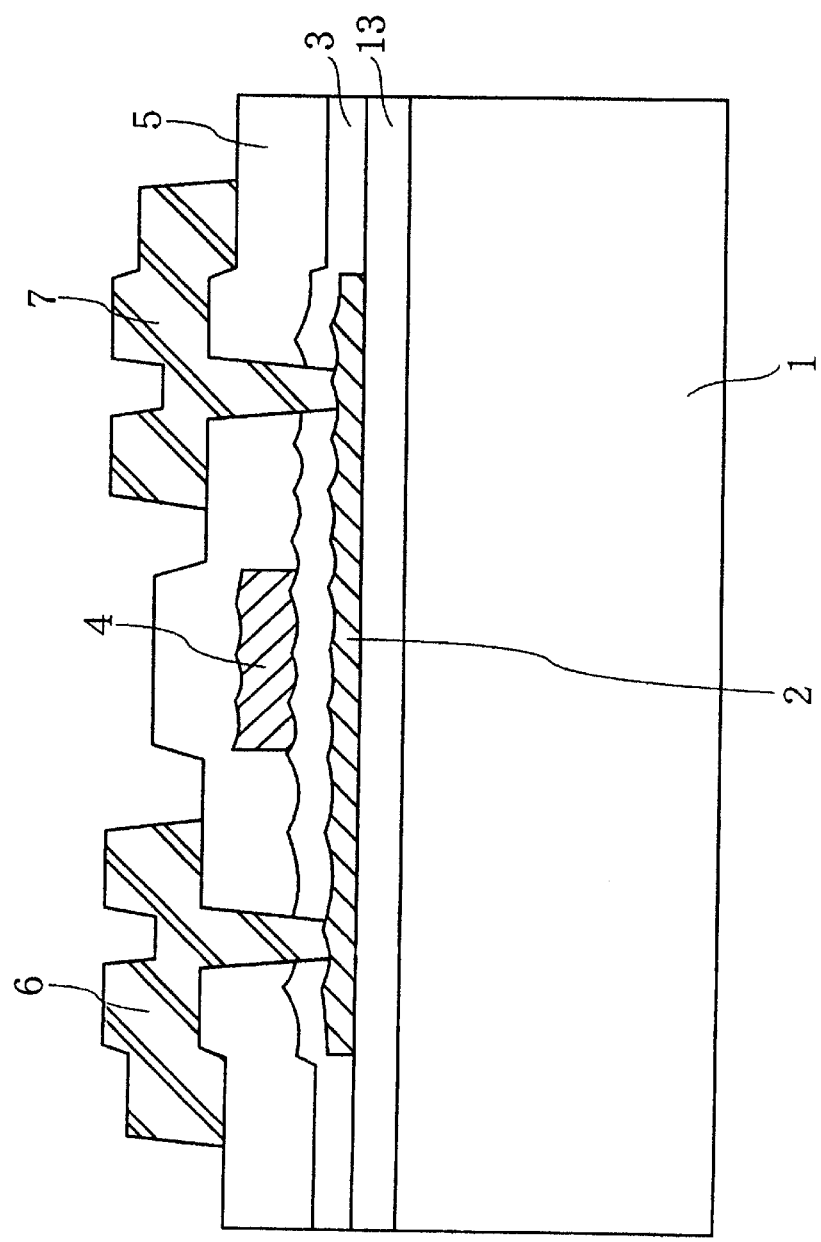
FIG. 1 is a cross-sectional view of a polycrystalline silicon thin-film transistor fabricated in accordance with a conventional method.
Figure 2:
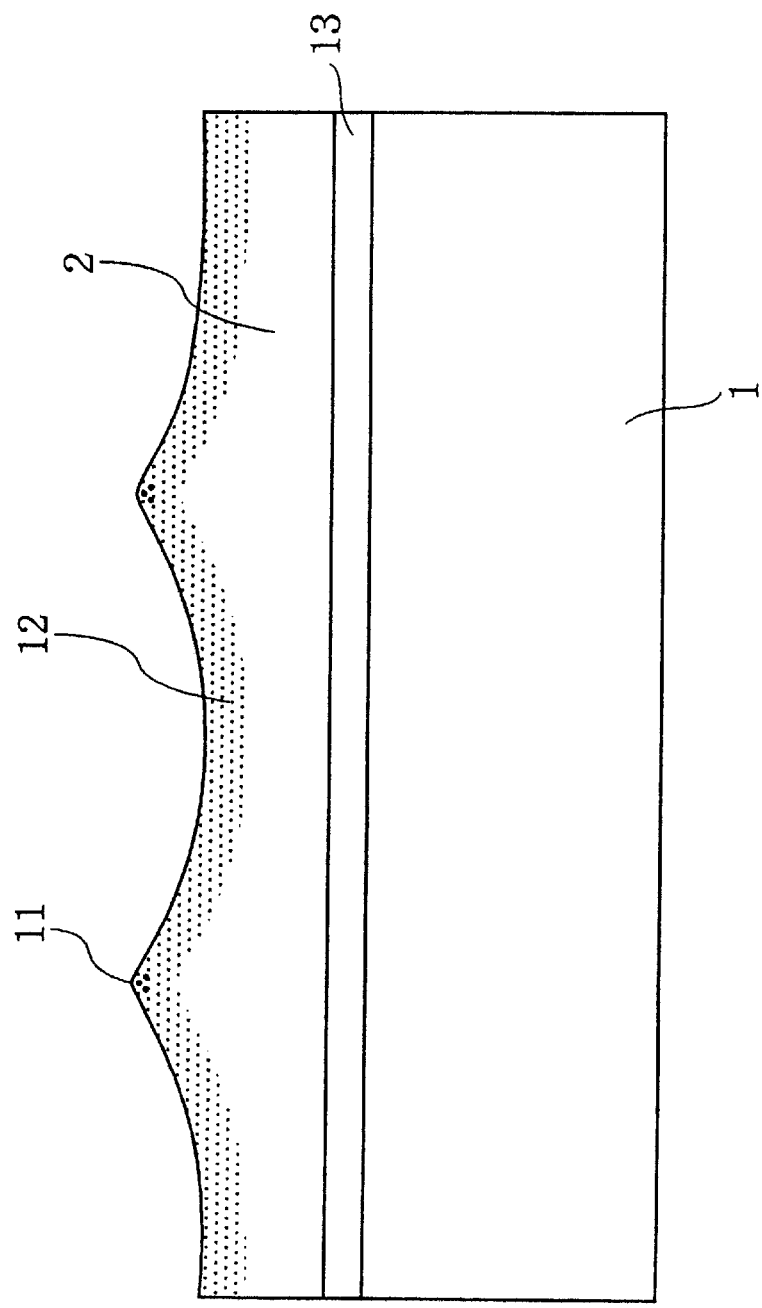
FIG. 2 is a view conceptually showing projections at a surface of a polycrystalline silicon thin film formed conventionally by laser annealing and the segregation of a tramp material.

In the drawings, the same portions as shown in FIGS. 1 and 2 are designated at the same reference numerals. The same shall apply to the other embodiments. 1 denotes a transparent insulating substrate. In the present embodiment, a 1737 glass substrate commercially available from Corning, Inc. is used as the transparent insulating substrate 1. 2 denotes a polycrystalline silicon thin film. 3 denotes a gate insulating film, which is a silicon dioxide thin film formed by PCVD in the present embodiment. 4 denotes a gate electrode, which is a thin film made of tantalum with excellent heat resistance and excellent corrosion resistance in the present embodiment. 5 denotes an interlayer insulating film, which is a silicon dioxide thin film formed by normal pressure chemical vapor deposition in the present embodiment. 6 denotes a source electrode and 7 denotes a drain electrode. In the present embodiment, each of the electrodes 6 and 7 has a two-layer structure consisting of an upper portion made of aluminum with low electric resistance and a lower portion 61, 71 made of titanium with excellent electric contact since a silicide is formed at the contact portion with silicon. The film formation was performed by sputtering. 13 denotes an underlying layer, which is a silicon dioxide thin film produced by PCVD in the present embodiment. 15 denotes an amorphous silicon thin film, which was formed by PCVD in the present embodiment.

A method of fabricating the thin-film semiconductor element will be described with reference to FIGS. 4.

(a) The underlying layer 13 is formed on the transparent insulating substrate 1 and the amorphous silicon thin film 15 is formed thereon.

(b) The amorphous silicon thin film 15 is processed into a specified pattern determined by the arrangement of semiconductor elements on the substrate by using a photolithographic process and a dry-etching process. The reason for performing dry etching, not wet etching, is that dry etching is advantageous at present for the processing of a semiconductor element having a channel region with a length of about 1 μm to 10 μm in terms of achieving accuracy and no selective etching of grain boundaries.

(c) The amorphous silicon thin film 15 is melted and solidified with the application of a laser using, e.g., XeCl (at a wavelength of 308 nm) as an excimer laser in a hydrogen gas atmosphere at about 0.5 Torr (so-called laser annealing), thereby forming the polycrystalline silicon thin film 2 with a thickness of about 20 to 200 nm, more preferably about 30 to 100 nm, though the thickness differs slightly depending on the usage of the liquid crystal display device and the type of a liquid crystal in use. As a result, numerous projections 11 are formed at an upper surface of the polycrystalline silicon thin film and tramp materials 12 are segregated at the surface, particularly in the projections. At present, it is difficult to prevent completely the mixture of the tramp materials in the silicon thin film even if various precautions are taken by performing preceding processes in vacuum provided that circumstances permit, cleaning the substrate, or the like.

(d) A gas mixture of carbon fluoride ($CF_4$) and oxygen ($O_2$) is plasma-excited in vacuum by using a microwave plasma etching apparatus so that only polyvalently charged active species are guided to the surface of the polycrystalline silicon thin film. Then, some surface portions of the polycrystalline silicon thin film, particularly the projections, are etched away with an active, reactive gas so that surface planarization is achieved by reducing the regions and projections containing the tramp materials such as oxygen, hydrogen, and boron in large quantities.

It is to be noted that the projections at the surface, particularly the portions in which the tramp materials have been segregated, are more likely to be removed by the reactive gas during etching since they are more chemically unstable than the other portions. In particular, a needle-like projection, which is conceptually similar to a lighting rod and might have an adverse effect on the insulation resistance of the gate insulating film, has an accordingly high ratio of surface area to volume, though it is not shown in FIG. 2. In this respect, the needle-like projection is more likely to be removed by reaction. As a result, the polycrystalline silicon thin film is planarized as if naturally.

(e) To prevent surface recontamination, the substrate is moved to another chamber, while it is held in vacuum. Then, a silicon dioxide thin film is formed as the gate insulating film on a surface of the polycrystalline silicon thin film by PCVD.

Thereafter, the gate electrode 4, the interlayer insulating film 5, the source electrode 6, and the drain electrode 7 are formed by a method similar to the conventional method, whereby the thin-film transistor as shown in FIG. 3 is fabricated.

The characteristics of the thin-film transistor thus fabricated was compared with those of the thin-film transistor fabricated by the conventional method. As a result of the comparison, it was found that the thin-film transistor according to the present embodiment has much improved characteristics since the mobility thereof was about 200 $cm^2$/V·s in contrast to the mobility of the thin-film transistor fabricated by the conventional method, which was about 120 $cm^2$/V·s.

In a BT test for measuring the degradation of TFT characteristics with the application of a DC at 30 V to the gate electrode, a reliability improvement of about two orders of magnitude was observed at a condition (60° C.) where normal operation is guaranteed as a result of an acceleration test at 85° C.

Further, the insulation resistance of the TFT was also improved.

One reason for the improved insulation resistance may be that the surface of the polycrystalline silicon thin film immediately under the gate electrode contains the impurity in a reduced quantity and has become flat. Another reason may be the obtention of the gate insulating film with a clean interface since it was formed while being held in vacuum after etching without being exposed to a contaminant.

Since the surface of the silicon film contains no impurity, successful formation of a silicide by a reaction between titanium in the lower portions of the source and drain electrodes and silicon is also qualitatively contributable to improved performance.

Although the present embodiment has formed the amorphous silicon thin film into a pattern prior to polycrystallization, it will be understood that the amorphous silicon thin film may also be formed into a pattern after polycrystallization.

Although the etching of the polycrystalline silicon thin film has used the active species that have been plasma-excited from the beginning, it is also possible to initially perform reactive ion etching having an additional effect of ions and then perform etching using only the active species that have been plasma-excited. In this case, however, only the active species (radicals) generated by plasma excitation are used preferably at the final stage of etching with the view to eliminating damage induced by ion bombardment to the polysilicon film.

It will be appreciated that the active species may be generated by another means such as UV irradiation.

Although the present embodiment has performed etching using the gas mixture of $CF_4$ and $O_2$, it will be understood that another composition ratio or another type of gas may be used depending on conditions including environmental conditions in fabrication facilities and the presence or absence of tramp materials or if the material of the semiconductor is silicon/germanium or silicon/germanium/carbon.

It will be appreciated that, if wet etching is improved or another etching means is developed for the removal of the projections at the polycrystalline silicon surface as technology advances in the future, the means may also be used.

Embodiment 2

The present embodiment also belongs to the first group of the invention. The present embodiment relates to the planarization of a polycrystalline silicon thin film performed by using a resin film.

Figure 5:
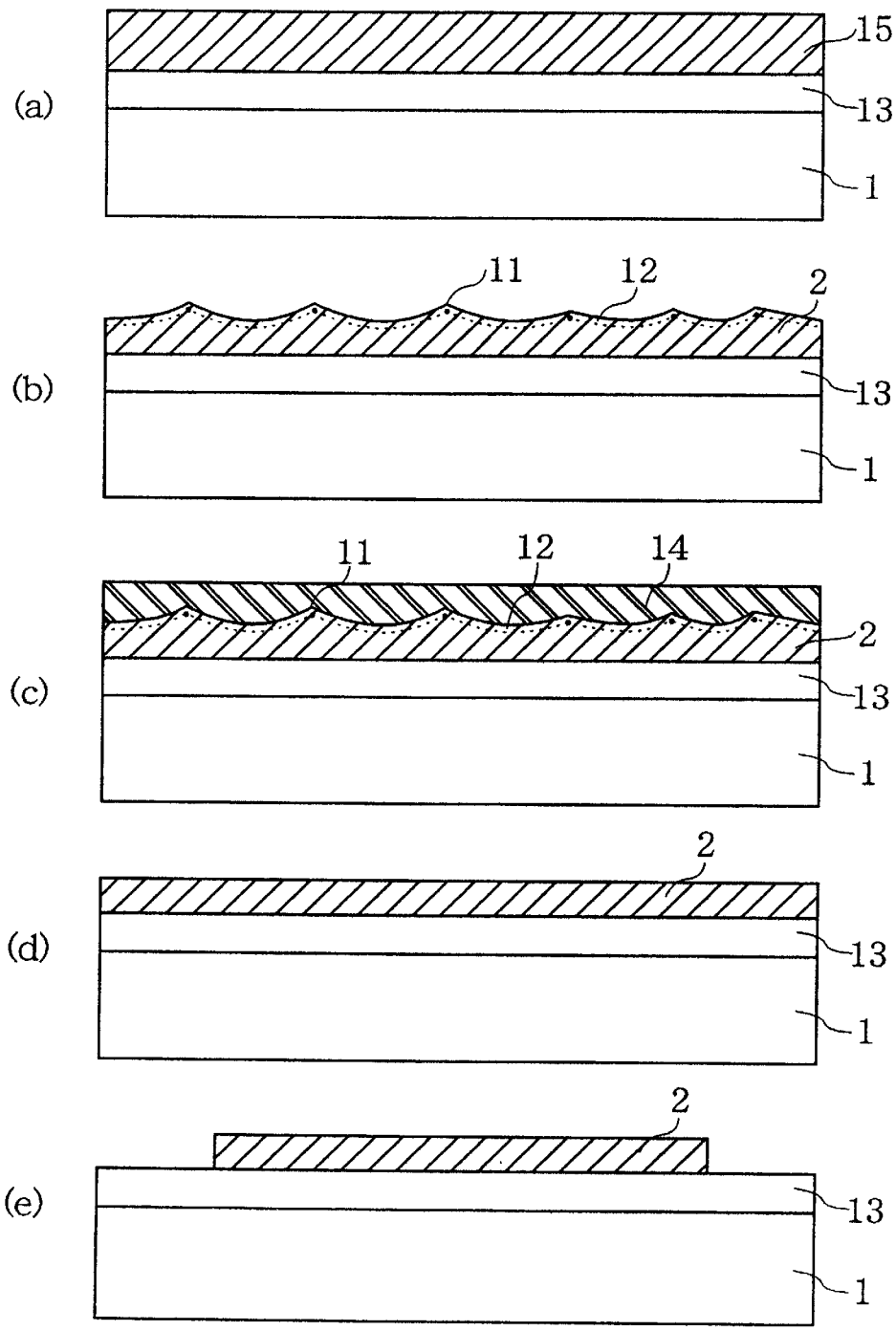
FIG. 5 are views showing the cross-sectional structure of a polycrystalline silicon thin-film transistor as a second embodiment of the present invention, which changes as the fabrication thereof proceeds.

A method of fabricating a thin-film transistor according to the present embodiment will be described with reference to FIG. 5.

(a) An underlying layer 13 is formed on a transparent insulating substrate 1 and an amorphous silicon thin film 15 is formed thereon, similarly to the first embodiment described above.

(b) Likewise, a polycrystalline silicon thin film 2 is obtained by irradiating an amorphous silicon thin film 15 with an excimer laser. As a result, projections 11 and segregation 12 of tramp materials occur at a surface of the polycrystalline silicon thin film.

(c) A planarizing film made of polymethyl methacrylate (PMMA) is formed by spin coating which essentially allows the formation of a flat film.

(d) Reactive ion etching is performed in vacuum by using a gas mixture containing about 75% carbon fluoride ($CF_4$)

and about 25% hydrogen ($H_2$). In this case, since PMMA and the polycrystalline silicon thin film have the same etching speed, if etching is performed till the entire surface of the polycrystalline silicon thin film is exposed, the top portion of the polycrystalline silicon thin film is graded naturally and a flat surface is provided. In the same manner, the surface portions in which the tramp materials are segregated are removed.

(e) The planarized polycrystalline silicon thin film 2 is processed into a specified pattern configuration by a photolithographic process and an etching process.

Thereafter, a gate insulating film is formed by PCVD and a gate electrode film, an interlayer insulating film, and source and drain electrode films are formed, similarly to the conventional method, whereby a thin-film transistor having the same structure as the thin-film transistor according to the foregoing embodiment is fabricated.

Since the thin-film transistor fabricated in accordance with the foregoing method has an excellently flat polycrystalline silicon thin film, it showed greatly improved characteristics, including a mobility of about 250 $cm^2 \cdot /vs$, and reliability that has been improved about 200-fold compared with the reliability of the thin-film transistor fabricated by the conventional method.

Although the present embodiment has used PMMA as the material of the planarizing film, the material of the planarizing film is not limited thereto. If a photoresist is used, e.g., similar effects are achievable provided that a proper etching gas is selected.

The etching speed for the material of the planarizing film need not be exactly or nearly the same (±5%, preferably ±1%) as the etching speed for polycrystalline silicon, since the planarizing film is etched to planarize the surface of the polycrystalline silicon thin film. It will be appreciated that a difference of about ±20% is permissible provided that etching is stopped with appropriate consideration.

In the present embodiment, a target of etching is a flat and uniform PMMA film so that polycrystalline silicon is removed at the final stage of etching. Accordingly, the grain boundaries of polycrystalline silicon are scarcely etched selectively even by wet etching. Consequently, the use of wet etching is possible even with the current technology, though slight precautions are required for the control of etching.

It will be understood that, even when a semiconductor material other than silicon is used, the material of the planarizing film is selected properly depending on the etching speed.

Although the present embodiment has similarly performed etching by using reactive ions till the projections of the polycrystalline silicon thin film are exposed and then performed etching by using only active species that have been plasma-excited, it is also possible to perform etching by using only the active species that have been plasma-excited from the beginning, if time constraints are not considered. However, only the active species (radicals) generated by plasma excitation or UV irradiation are used preferably at least at the final stage of the etching of the polycrystalline silicon thin film.

It will be understood that the material for planarization may be coated in accordance with a method other than spin coating, depending on the property, such as low viscosity, or type of the material. For example, it is also possible to simply apply the material for planarization.

Embodiment 3

The present embodiment pertains to the second group of the invention. The present embodiment is for planarizing a polycrystalline silicon thin film by using a thin film made of a high-hardness material.

A method of fabricating a thin-film semiconductor according to the present embodiment will be described with reference to FIGS. 6 and 7.

Figure 6:
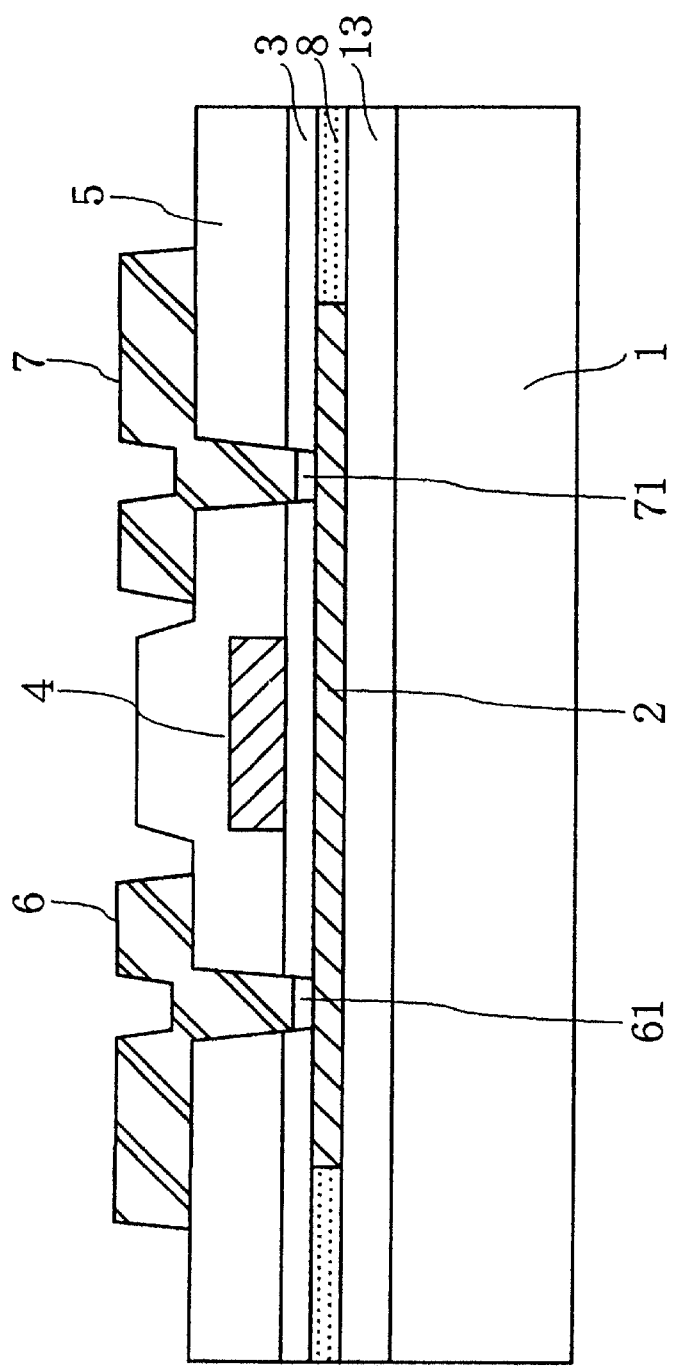
FIG. 6 is a cross-sectional view of a polycrystalline silicon thin-film transistor fabricated in accordance with a fabrication method of a third embodiment of the present invention.

FIG. 6 is a cross-sectional view of the thin-film transistor element of the present embodiment. FIG. 7 are views showing the cross section of the thin-film transistor, which changes as the fabrication thereof proceeds.

In each of the drawings, 8 denotes a thin film with a high hardness made of a silicon nitride.

Figure 7:
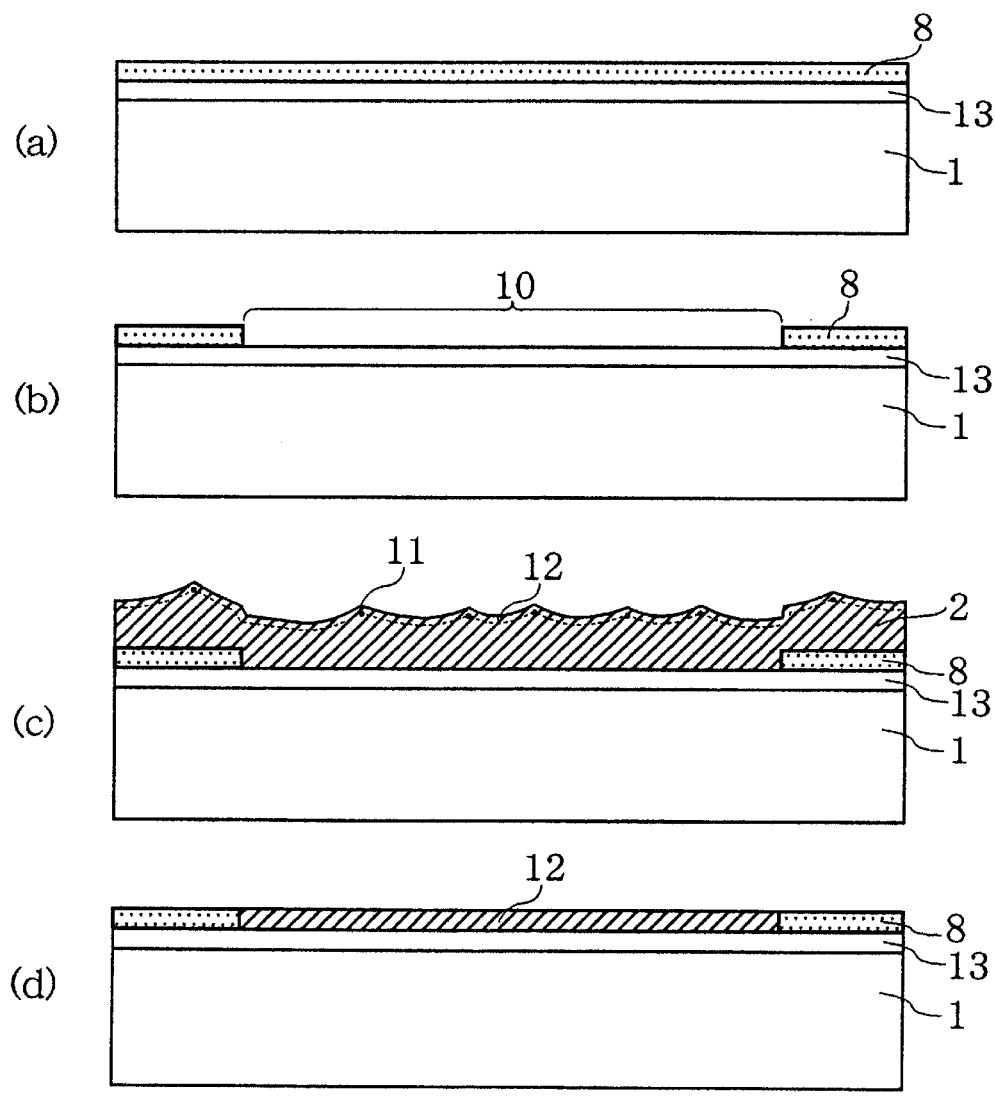
FIG. 7 are views showing the cross-sectional structure of the polycrystalline silicon thin-film transistor in the foregoing embodiment, which changes as the fabrication thereof proceeds.

Referring to FIG. 7, the method of fabricating the thin-film semiconductor element of the present embodiment will be described in detail.

(a) A silicon nitride film is formed over the entire surface of a transparent insulating substrate (1737 glass substrate commercially available from Corning, Inc.) having an underlying layer 13 formed on the surface thereof. In the present embodiment, the silicon nitride film as the thin film 8 with a high hardness is formed to have a thickness of about 0.1 $\mu m$ by PCVD using a gas mixture of $SiH_4$, $N_2$, and $NH_3$ at a temperature of about 350° C. The respective hardnesses of the film and polycrystalline silicon were about 2000 and about 850 on micro-Vickers hardness scale.

(b) The thin film 8 with a high hardness formed in the region of the substrate in which the transistor is to be formed is removed therefrom by a photolithographic process and dry etching. The reference numeral 10 denotes the region in which the transistor is to be formed.

(c) An amorphous silicon thin film is formed over the entire surface of the transparent insulating substrate 1 on which the thin film 8 with a high hardness has been formed selectively. The amorphous silicon thin film is irradiated with a laser beam to be melted and solidified for recrystallization, thereby forming a polycrystalline silicon thin film 2. During the process, the melting and solidification resulting from irradiation with the laser beam produces numerous projections 11 and portions 12 in which tramp materials are segregated at a surface of the polycrystalline silicon thin film.

(d) The substrate formed with the polycrystalline silicon thin film is polished by so-called CMP (Chemical Mechanical Polishing). Specifically, silica is mechanically and chemically polished with a slurry prepared by mixing a colloidal silica or the like with a grain diameter of 5 to 100 nm in 5 to 10% pure water and further dissolving ammonia therein such that a pH of about 12 is achieved.

In the planarization process by polishing, the progress of the polishing of the silicon nitride along with the polycrystalline silicon film portion is substantially halted at the time at which the silicon nitride film is exposed because of the extremely high hardness of the silicon nitride. As a result, the thickness of the polycrystalline silicon thin film becomes nearly or practically the same as the thickness of the silicon nitride film. The silicon nitride film can be formed to have a thickness controlled with high accuracy by sputtering or plasma chemical vapor-phase deposition. Consequently, the thickness of the polycrystalline silicon thin film after polishing can also be controlled with high accuracy. Accordingly, the thickness of the silicon nitride film is adjusted normally to 20 to 200 nm, preferably about 30 to 100 nm.

In recent years, the approach of causing silicon to contain, as a semiconductor material, carbon or germanium located above or below silicon on a periodic table has been adopted. In this case, relatively large projections and depressions compared with the case where pure silicon is used may be produced at a surface of the semiconductor thin film, since a mixture is used. In this case also, however, planarization and homogenization can be achieved with no problem, slight consideration should be given to an optimum grain diameter, an optimum pH, and the like.

At the same time, the formation of the polycrystalline silicon thin film into a specified pattern determined by the arrangement of transistor elements on the substrate is completed.

Thereafter, the substrate is cleaned, a gate insulating film is formed on the polycrystalline silicon thin film, contact holes leading to source and drain electrodes are formed by etching for each of the semiconductor elements, and gate, source, and drain electrodes are formed, whereby the polycrystalline silicon thin-film transistors are produced.

As shown in FIG. 6, each of the thin-film transistors fabricated by the foregoing method has the polycrystalline silicon thin film 2 with a flat surface and the tramp materials have been removed therefrom. This brings the interface with the gate insulating film formed thereon into an extremely satisfactory state and greatly improves the performance of the thin-film transistor.

The characteristics of the polycrystalline silicon thin-film transistor thus fabricated in the present embodiment were compared with those of the polycrystalline silicon thin-film transistor fabricated by the conventional method. When the width and length of the channel portion of the transistor were W/L=12/12 $\mu$mm and Vd=6 V, the mobility of the transistor fabricated by the conventional method was 120 $cm^2$/Vs. By contrast, the mobility of the transistor of the present embodiment was 190 $cm^2$/Vs.

It was also found that the transistor of the present embodiment was excellent in reliability since the degradation rate thereof is about ten-fold lower than that of the conventional polycrystalline silicon thin-film transistor.

Subsequently, the amorphous silicon film may also be formed thick such that the thickness of the polycrystalline silicon thin film 2 is larger than that of the thin film with a high hardness. This ensures the removal by polishing of the tramp materials segregated at the surface of the polycrystalline silicon thin film 2. Since the amorphous silicon film has a large thickness during the polycrystallization thereof, crystal grains in the polycrystalline silicon film are larger in size accordingly. As a result, the mobility is further increased.

Although the present embodiment has used the thin film made of amorphous silicon as the semiconductor materiel, it is possible to use a thin film made of a silicon/germanium compound containing at most 30% germanium in silicon for the achievement of a higher mobility.

It is also possible to use a thin film made of a silicon/germanium/carbon compound containing at most 5% carbon in silicon and germanium.

As the thin film with a high hardness, a silicon oxynitride film, an aluminum oxide film, a titanium oxide film, or the like may also be used. In this case, since a transparent film is formed similarly to the present embodiment, it is unnecessary to remove the insulating film even after polishing, which simplifies the process steps. When used in a display device for portable equipment, the glass substrate on which the semiconductor thin film is formed is inevitably reduced in thickness. However, since a ceramic having a high hardness by nature is used, it contributes more or less to preventing the distortion or deformation of the thin glass substrate due to heat during the heat treatment for joining dangling bonds after ion implantation of impurities such as P or B into the semiconductor thin film.

Polishing may be a purely mechanical method depending on the materials of the high-hardness film or the semiconductor.

It will be appreciated that, instead of the transparent film, a high-hardness thin film made of a metal, an intermetallic compound, or a carbide may be used and etched away after polishing.

It will also be appreciated that the high-hardness thin film need not be removed in a display device of reflection type provided that it has an insulating property.

Embodiment 4

The present embodiment is different from the third embodiment described above in that a film 81 made of an aluminum oxide as a high-hardness material, instead of a silicon dioxide, is formed as the underlying layer on the upper surface of a transparent insulating substrate 1.

Figure 8:
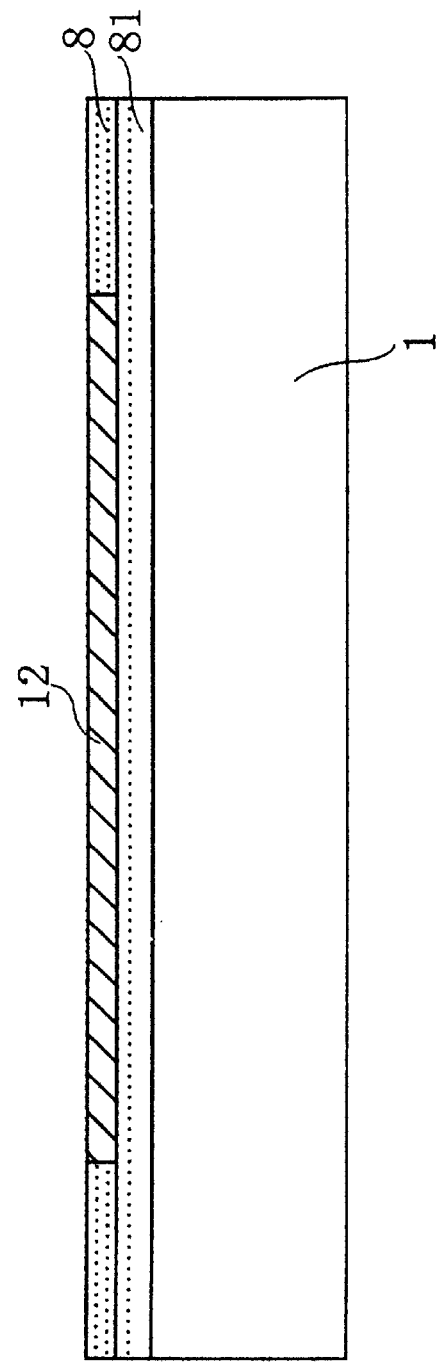
FIG. 8 is a cross-sectional view of a polycrystalline silicon thin-film transistor fabricated in accordance with a fabrication method of a fourth embodiment of the present invention.

Accordingly, the thin film made of a high-hardness material has a double-leveled structure consisting of the aluminum oxide film 81 and a silicon nitride film 8 in the region in which a polycrystalline silicon thin film is not present, as clearly shown in FIG. 8 corresponding to FIG. 7(*d*).

This prevents the distortion of a glass substrate even at a high temperature slightly exceeding 600° C. during a heat treatment after impurity ion implantation. As a result, the electric-field mobility of the thin-film transistor increases.

Embodiment 5

The present invention belongs to the third group of the invention and relates to a heat treatment performed in a special atmosphere.

Figure 9:
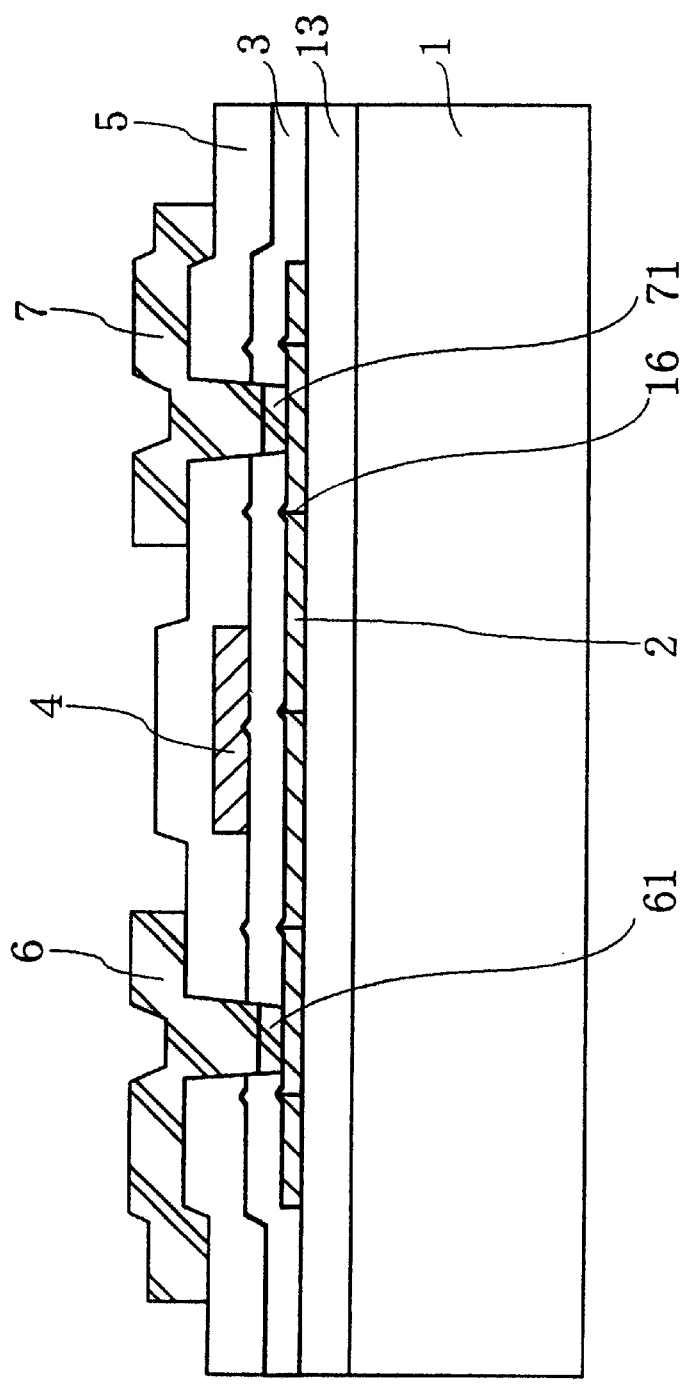
FIG. 9 is a cross-sectional view of a polycrystalline silicon thin-film transistor fabricated in accordance with a fabrication method of a fifth embodiment of the present invention.
Figure 10:
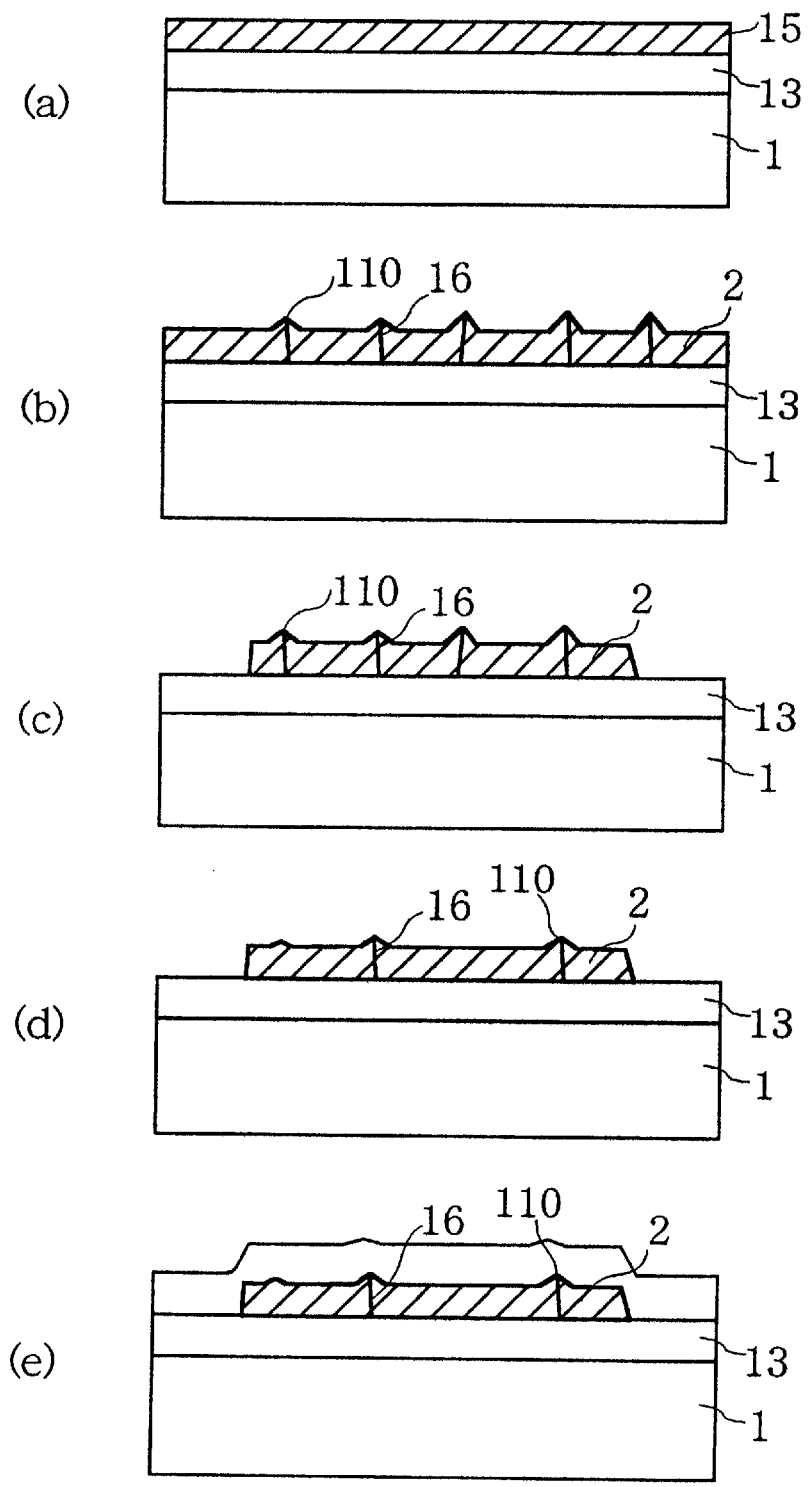
FIG. 10 are views showing the cross-sectional structure of the polycrystalline silicon thin-film transistor in the foregoing embodiment, which changes as the fabrication thereof proceeds.

FIG. 9 is a structural cross section of a thin-film transistor fabricated in accordance with a fabrication method of the present embodiment. FIG. 10 are views showing the cross sections of the thin-film transistor as a partially fabricated item in the main fabrication process steps thereof.

Referring to FIG. 10, the fabrication method of the present embodiment will be described in detail.

(a) An underlying layer 13 is formed on a transparent insulating substrate 1 and an amorphous silicon thin film 15 is formed thereon.

(b) The polycrystallization of the amorphous silicon thin film 15 is performed by irradiating it with an excimer laser beam, thereby forming a polycrystalline silicon thin film 2. The polycrystallization is performed with the use of a laser beam using, e.g., XeCl (at a wavelength of 308 nm) as an excimer laser in a hydrogen gas, in a nitrogen gas, or in vacuum. As a result, a structure showing swells 110 at respective surfaces of grain boundaries 16 is observed in the polycrystalline silicon thin film.

(c) The polycrystalline silicon thin film 2 is processed into a specified pattern by photolithographic and etching processes.

Figure 11:
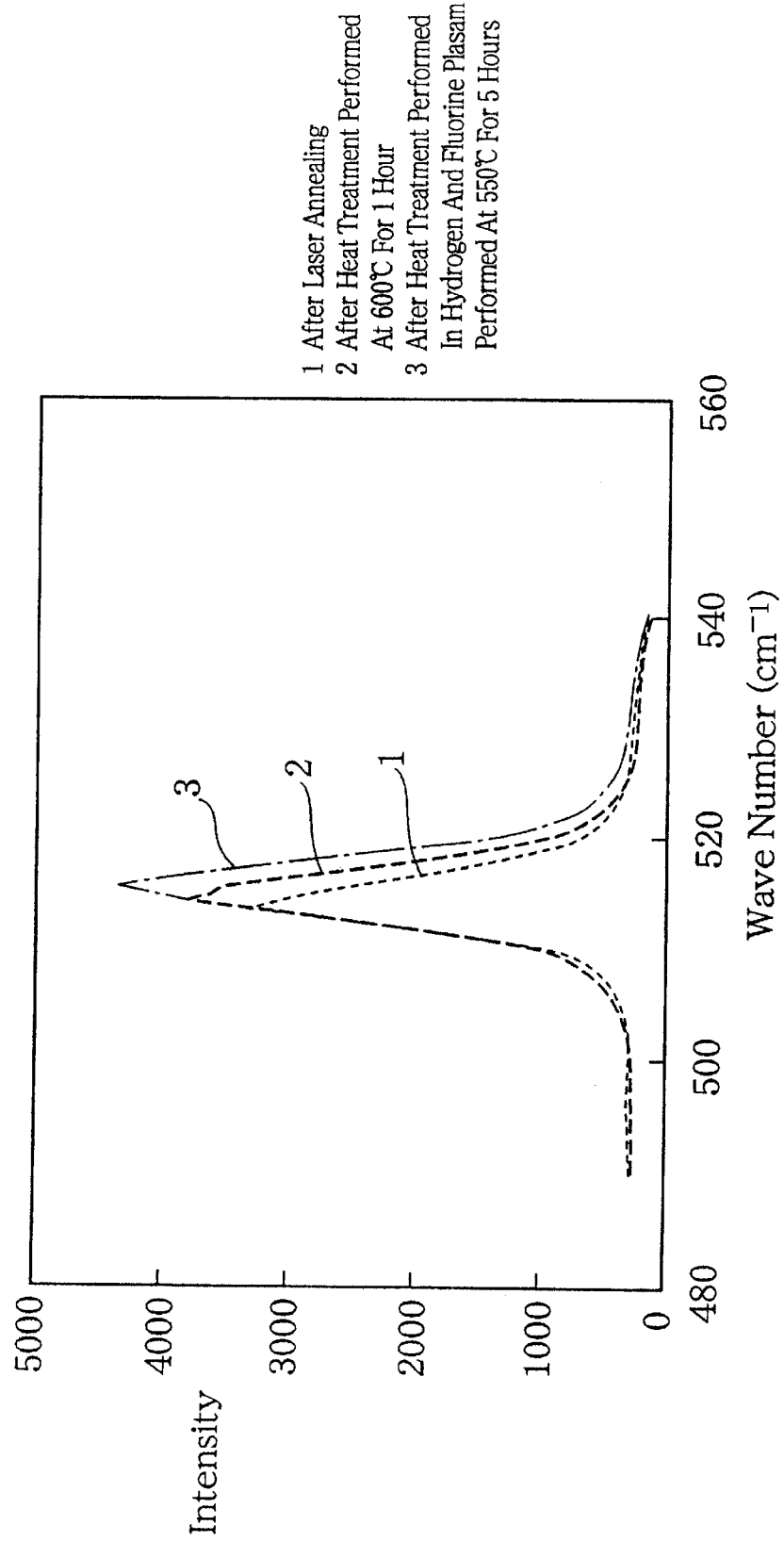
FIG. 11 is a view showing the results of a performance test conducted on polycrystalline silicon thin-film transistors fabricated in fifth and sixth embodiments of the present invention.

Such a polycrystalline silicon thin film 2 is placed in a vacuum heat treatment furnace and subjected to a heat treatment performed at 600° C. for 1 hour, which is the upper-limit temperature determined by the deformation resistance of the glass substrate. The result of evaluating the polycrystalline silicon thin film before and after the heat treatment by Raman spectroscopic analysis is shown in FIG. 11. In the drawing, 1 denotes the film immediately after polycrystallization using a laser and 2 denotes the film after the heat treatment.

As can be seen from the drawing, the peak intensity is increased by the heat treatment and the peak position has shifted toward larger wave numbers. The peak position approaching 520 $cm^{-1}$, which is the peak position of monocrystalline silicon, as a result of the heat treatment indicates that the heat strain of the whole film has been reduced and the increased peak intensity indicates that crystal growth has occurred, so that the effects of the present embodiment have been proved.

Such a result is diagrammatically shown in FIG. 10(d). Compared with FIG. 10(c), the number of grain boundaries 16 decreases and the projections are reduced in size with the growth of the crystal.

(e) Thereafter, a silicon dioxide thin film 3 is formed by PCVD as a gate insulating film.

After the gate insulating film is thus formed, a gate electrode 4, an interlayer insulating film 5, and source and drain electrodes 6 and 7 are formed, whereby a thin-film transistor as shown in FIG. 9 is fabricated.

The characteristics of the thin-film transistor were such that the mobility was about 220 cm$^2$/V·s and the threshold voltage (Vth) was 2 V. By contrast, the transistor fabricated by the conventional method had a mobility of 120 cm$^2$/V·s and Vth of 3 V.

A comparison was made between the respective reliabilities of the transistor of the present invention and the conventional transistor under the same conditions, with the result that the reliability of the transistor of the present invention had improved by two orders of magnitude compared with that of the conventional transistor.

These are attributable to an improvement in the film quality of the semiconductor mainly due to the grain boundaries that have been reduced by the reduction in the thermal stress of the polycrystalline silicon thin film and by the growth of crystal grains, to excellent and uniform contact with the gate insulating film underlying the gate electrode due to the reduced swells of the grain boundary portions at the semiconductor surface, and to excellent uniformity of the implanted impurity.

Although the present embodiment has performed the heat treatment in an vacuum atmosphere at 600° C. for 1 hour, the heat treatment is more preferably performed in an atmosphere of an inert gas containing hydrogen since, if the heat treatment is performed in the atmosphere of an inert gas containing hydrogen, an oxide in the surface, particularly an unstable oxide, is reduced and the film quality of polycrystalline silicon is further improved, though the arrangement, preparation, control, and the like of the inert gas containing hydrogen are required.

Although the present embodiment has performed the heat treatment after processing the polycrystalline silicon thin film into a specified pattern, it will be appreciated that the procedure may be reversely performed by processing the polycrystalline silicon thin film into a specified pattern after the heat treatment.

Embodiment 6

The present embodiment also belongs to the third group of the invention.

A method of fabricating a thin-film transistor as the sixth embodiment of the present invention will be described herein below.

Since the present embodiment is basically the same as the fifth embodiment described above, the description will be given by extensively using FIG. 10 used in the description of the foregoing embodiment.

(a) After a silicon dioxide thin film is formed as an underlying layer on a transparent insulating substrate 1 by PCVD, an amorphous silicon thin film is formed on the upper surface thereof, similarly to the fifth embodiment described above.

(b) Similarly, the amorphous silicon thin film is irradiated with an excimer laser to be polycrystallized.

The conditions for the irradiation are optimized in consideration of the thickness of the amorphous silicon thin film, an atmosphere in which the irradiation with the laser is performed, and the like such that crystal grain diameters in the polycrystalline silicon thin film are increased and variations in grain diameter and surface roughness are reduced.

Figure 12:
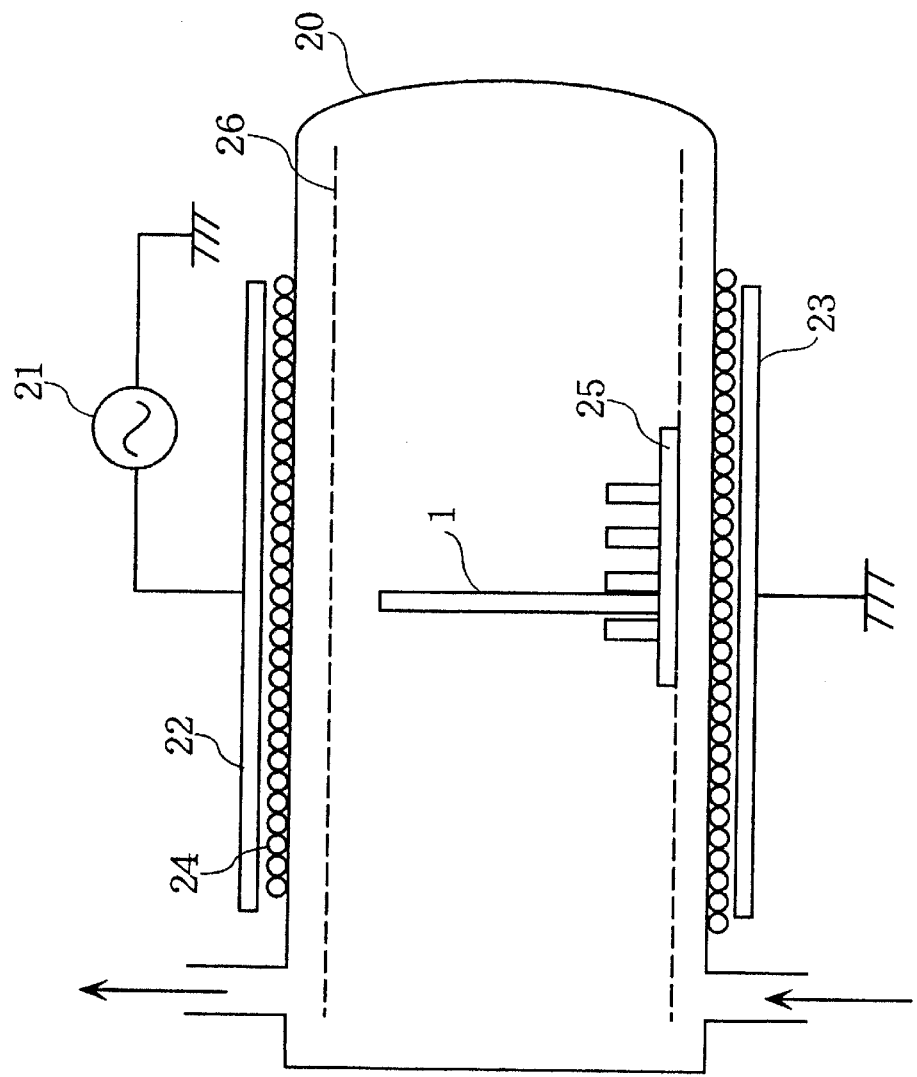
FIG. 12 is a view of an apparatus used for the heat treatment of the polycrystalline silicon thin-film transistor in the sixth embodiment.

(c) After the polycrystalline silicon thin film is patterned into a specified configuration, a heat treatment is performed in an apparatus capable of performing high-temperature heating and generating a plasma, as shown in FIG. 12.

In the drawing, 20 denotes a bell-jar (vacuum container) made of quartz. 21 denotes a plasma excitation power source. In the present embodiment, 13.56 MHz was used. 22 and 23 denote RF electrode plates. 24 denotes a heater for heat application. 25 denotes a substrate holder. 26 denotes a mesh electrode. 1 denotes the transparent insulating substrate formed with the polycrystalline film.

By using the apparatus, a gas composed of 20% hydrogen, 3% $CHF_3$, and 77% Ar is allowed to flow at a temperature of 550° C., as indicated by the two arrows in the lower portion. A plasam is generated with the RF power source and a heat treatment is performed for 5 hours.

(d) In the plasma generated in the system, a voltage is hardly induced at the substrate so that hydrogen or fluorine radicals (in the form of atoms or multivalent atoms) primarily impinge on the substrate. It is to be noted that fluorine has the effect of etching away the oxide film present on the surface of the polycrystalline silicon thin film and further etches away an oxide and an oxide film present at grain boundaries. An oxide emerging on the upper surfaces of the grain boundaries due to thermal diffusion is also removed. As a result, a clean silicon surface is exposed at the grain boundary portion, silicon atoms are brought into contact with each other, and crystal grains grow. With the growth, surface roughness is reduced so that the film quality and surface configuration are improved simultaneously.

The result of measuring the quality of the monocrystalline silicon thin film in the state shown diagrammatically in (d) by Raman spectroscopic analysis is designated at 3 in FIG. 11. As can be seen from the drawing, the peak intensity is higher than in the foregoing embodiment and the peak position is closer to 520 cm$^{-1}$, which is the peak position of monocrystalline silicon. This proves that the crystal properties have been improved satisfactorily.

Thereafter, a gate insulating film, a gate electrode film, an interlayer insulating film, a source electrode film, and a drain electrode film are formed similarly to the other embodiments, whereby the thin-film transistor is fabricated.

The thin-film transistor thus produced had a mobility of about 300 cm$^2$/V·s and Vth=1.3 V, which indicates that the characteristics of the thin-film transistor have been improved greatly compared with those of the thin-film transistor fabricated by the conventional method.

Compared with the thin-film transistor fabricated by the conventional method, an approximately 250-fold reliability improvement was observed.

Although the present embodiment has used an RF power source composed of an electrode of external-excitation type, it will be understood that the RF power source may be used inside the bell-jar.

It will also be understood that an insulating substrate formed with polycrystalline silicon may be exposed to a plasma generated in accordance with an opposed electrode system, similarly to the etching apparatus.

It will also be understood that only hydrogen or an inert gas containing a hydrogen gas may be used as the gas, though the heating temperature and time are different from the case where the gas containing fluorine are different.

It will also be understood that the plasma may be generated by another means such as UV irradiation. Unlike the first to fourth embodiments, the present embodiment and the foregoing fifth embodiment are also applicable to a bottom-gate-type transistor in terms of removing the oxide or the like present at the grain boundaries and promoting crystal growth. In addition, the effect of improving the mobility with the growth of crystal grains is also obtainable with no problem.

It will also be appreciated that a reliability improvement is also achievable, though it is not so remarkable as in the top-gate-type transistor.

Figure 13:
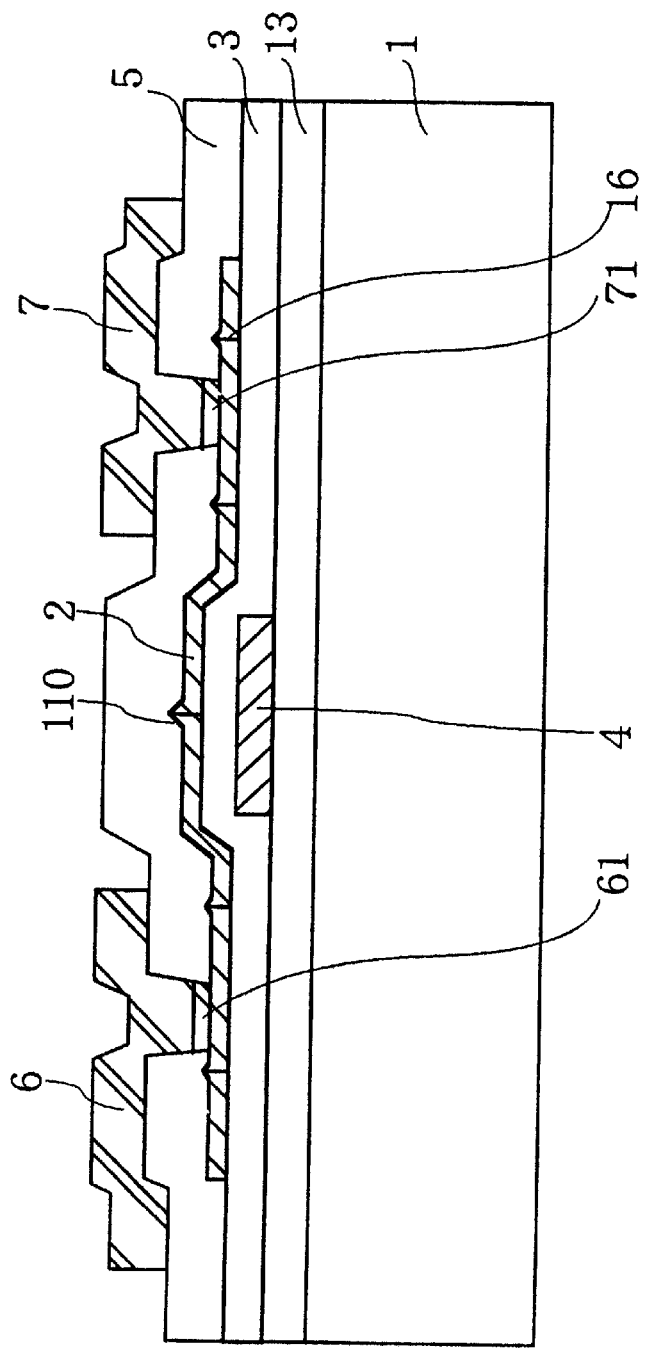
FIG. 13 is a structural cross section of a bottom-gate-type thin-film transistor fabricated in accordance with a fabrication method of the sixth embodiment.

For reference, a bottom-gate-type transistor corresponding to the top-gate-type transistor shown in FIG. 9 is shown in FIG. 13.

Although the present invention has been described above based on the several embodiments thereof, it will be appreciated that the present invention is not limited thereto. Specifically, the following arrangements have been adopted.

(1) The liquid crystal display device is of reflection type or projection-display type using G.H. cells, not of light transmission type with a back light used in a normal word processor.

(2) If the liquid crystal display device is of reflection type, it requires the labor of forming an additional reflection film on the pixel portion of the substrate. However, the substrate is composed of a thin plate made of metal or ceramic, which is excellent in heat resistance, and the heat treatment temperature for the polycrystalline silicon thin film in the fifth and sixth embodiments is increased accordingly to 700 to 800° C.

(3) The substrate is made of quartz and the heat treatment temperature for the polycrystalline silicon thin film is increased to 700 to 800° C.

(4) Since the liquid crystal display device itself is for use in a game machine or the like, a display portion and a driving circuit portion are not formed entirely over the surface of the substrate. Accordingly, the amorphous silicon film is formed on the regions serving as the display portion and the diving circuit portion, not entirely over the surface of the substrate.

(5) The insulating film underlying the glass substrate is composed of a multilayer structure consisting of a silicon dioxide and a silicon nitride, not of a single film, to surely prevent the diffusion of an alkaline metal from glass into silicon.

(6) Both the projections on the polycrystalline silicon thin film and the swells of the grain boundaries are removed.

(7) The titanium film in the lower portions of the source and drain electrodes are formed thicker than shown in the drawings. Alternatively, another metal is used. Further, the both electrodes are formed only of one metal material.

INDUSTRIAL APPLICABILITY

As can be understood from the foregoing description, the present invention brings the interface between the polycrystallized silicon thin film or the like and the gate insulating film into a flat and highly pure state by removing the projections formed at the surface of the silicon thin film, the swells of the grain boundaries, and particularly the tramp materials segregated in the projections when the amorphous silicon thin film or the like is irradiated with an excimer laser and thereby polycrystallized in the top-gate-type transistor. This greatly improves the characteristics and reliability of the thin-film transistor.

Since the projections at the surface of the polycrystaline silicon thin film or the like and the segregation of the tramp materials are eliminated in the top gate-type transistor, the stability and reproducibility of the interfacial portion with the gate insulating film are also improved, which improves the characteristics of the transistor element and reduces variations therein. Moreover, reliability is also improved.

By heating the thin film made of polycrystallized silicon or the like at a temperature of 550° C. or more by using a plasma or radicals of hydrogen, an inert gas containing hydrogen, or a gas containing hydrogen and fluorine in particular in the top-gate-type transistor, the oxide at the surface is removed, the growth of crystal grains is promoted, and the film quality is greatly improved.

This improves the characteristics of the transistor element and reduces variations therein. Moreover, reliability is also improved.

Since the insulation resistance of the transistor is improved, the gate insulating film can be thinned accordingly, which leads to a further improvement in TFT characteristics.

Since there is no surface projection and no swell of the gain boundary, impurity ions are accordingly implanted more uniformly, which also leads to an improvement in the characteristics of the transistor.

Moreover, excellent electric contact is provided between the lower ends of the source and drain electrodes and a semiconductor.

What is claimed is:

1. A method of fabricating a thin-film transistor, the method comprising:

forming a polycrystalline semiconductor thin film on a substrate by irradiating with a laser beam an amorphous semiconductor thin film located on the substrate;

heat treating the polycrystalline semiconductor thin film in a hydrogen atmosphere; and processing, prior to or after the heat treating, the polycrystalline semiconductor thin film into a specified configuration determined by the arrangement of semiconductor devices on the substrate.

2. The method of claim 1, wherein the heat treating is performed in an atmosphere of an inert gas containing hydrogen gas.

3. The method of claim 1, wherein the heat treating is performed in an atmosphere selected from a group consisting of a plasma atmosphere of hydrogen or an inert gas containing hydrogen, a plasma atmosphere of a gas containing hydrogen and fluorine, an atmosphere of a gas containing an active excited radical of hydrogen, and an atmosphere of a gas containing an active excited radical of each of hydrogen and fluorine.

4. The method of claim 1, wherein the amorphous semiconductor is a material selected from a group consisting of silicon, silicon/germanium, and silicon/germanium/carbon.

5. The method of claim 1, wherein the thin-film transistor is of top-gate type.

6. The method of claim 1, wherein the polycrystalline semiconductor thin film on a substrate is held on a substrate holder in a container enclosing the hydrogen atmosphere.

* * * * *

UNITED STATES PATENT AND TRADEMARK OFFICE
CERTIFICATE OF CORRECTION

PATENT NO. : 6,534,353 B1 Page 1 of 1
DATED : March 18, 2003
INVENTOR(S) : Keizaburo Kuramasu, Atsushi Sasaki and Tetsuo Kawakita It is certified that error appears in the above-identified patent and that said Letters Patent is hereby corrected as shown below:

<u>Title page,</u>
Item [62], change the text to read:
-- Divisional of Application No.
09/720,679, filed on December 29, 2000,
now Patent No. 6,506,669, a national
stage filing of PCT/JP99/03506 filed
June 29, 1999. --;

After Item [62], add item:
-- [30]  Foreign Application Priority Data
Jun 30, 1998    (JP) ..........H10-183759
Jul 01, 1998    (JP) ..........H10-185993
Apr 15, 1999    (JP) ..........H11-107880 --;

After References Cited, add:
-- U.S. PATENT DOCUMENTS
5,959,313       9/1999         Yamazaki et al.
6,333,071       11/2001        Zhang et al.
6,232,622       5/2001         Hamada --.

Signed and Sealed this

Eighteenth Day of November, 2003

JAMES E. ROGAN
*Director of the United States Patent and Trademark Office*